United States Patent
Chen

(10) Patent No.: US 6,680,656 B2
(45) Date of Patent: Jan. 20, 2004

(54) FUNCTION GENERATOR WITH ADJUSTABLE OSCILLATING FREQUENCY

(75) Inventor: Mu-Jung Chen, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 09/974,689

(22) Filed: Oct. 9, 2001

(65) Prior Publication Data

US 2002/0050868 A1 May 2, 2002

(30) Foreign Application Priority Data

Oct. 30, 2000 (TW) ........................................ 89122783 A

(51) Int. Cl.[7] ............................................... H03K 3/02
(52) U.S. Cl. ........................ 331/143; 331/111; 331/175; 331/176
(58) Field of Search ................................ 331/111, 175, 331/143, 176

(56) References Cited

U.S. PATENT DOCUMENTS 6,020,792 A * 2/2000 Nolan et al. ................. 331/111

* cited by examiner

*Primary Examiner*—Arnold Kinkead
(74) *Attorney, Agent, or Firm*—J. C. Patents

(57) ABSTRACT

An adjustable oscillating frequency function generator. The oscillating frequency of the function generator can be adjusted externally. The oscillation frequency is independent of the magnitude of the voltage source. Therefore, a pulse signal that withstands the voltage source signal can be provided.

14 Claims, 4 Drawing Sheets

Bias Circuit

FUNCTION GENERATOR WITH ADJUSTABLE OSCILLATING FREQUENCY

CROSS-REFERENCE TO RELATED APPLICATION

This application claims the priority benefit of Taiwan application Ser. No. 89122783, filed Oct. 30, 2000.

BACKGROUND OF THE INVENTION

1. Field of the Invention

The invention relates in general to a function generator with an adjustable oscillating frequency. More particularly, this invention relates to a function generator with an oscillating frequency, which can be adjusted independent of an external voltage source.

2. Description of the Related Art

Many computer accessories such as the mouse require low fabrication cost and low power consumption. These kinds of products are typical circuit design of CMOS devices. If an external quartz oscillator is used by the conventional method, drawbacks as follows occur. First, the fabrication cost is increased. Second, the design has to compromise the frequency specification of the quartz oscillator. Third, as shown in FIG. 1, the CMOS inverter used as a Pierce-type transistor oscillator of the amplifier includes a PMOS (MP), an NMOS (MN), a resistor Rf, and two capacitors C1 and C2. The CMOS inverter is connected to an operation voltage VDD As the capacitance of the capacitors C1 and C2 is sufficiently large, a large current is required while the oscillator is operating. To reduce the gain of the CMOS inverter for saving power, the frequency output of the oscillator will be stabilized through a long period of time, or even incorrect or incapable of oscillating.

SUMMARY OF THE INVENTION

The invention provides a function generator with an adjustable oscillation frequency that can be integrated in a CMOS circuit design with other digital circuits. Therefore, the function generator can be fabricated with a low cost and power consumption.

The function generator with an adjustable oscillating frequency is operated under an operation voltage (VDD). The function generator comprises a first comparator, a second comparator, a latch circuit, a capacitor, a first current source and a second current source.

The reference voltage of the first comparator is referred as the first reference voltage and the reference voltage of the second comparator is referred as the second reference voltage. The first reference voltage is larger than the second reference voltage. The latch circuit comprises a first input terminal, a second input terminal, a first output terminal and a second output terminal. The first and second input terminals are coupled to the output terminals of the first and the second comparators, respectively. Being latched by the latch circuit, the outputs of the first and second comparators are then output from the first and the second output terminals. The capacitor has one terminal grounded, and has a voltage level of the other terminal as a comparing voltage. The first and second current sources charge and discharge the capacitor unit via a first and a second switches. The voltage level of the first output terminal of the latch circuit controls the first switch, while the voltage level of the second output terminal of the latch circuit controls the second switch. When the comparing voltage is smaller than the second reference voltage, the voltage level at the first output terminal is at a high potential (the first output terminal is said to be "High"), and the voltage level at the second output terminal is at a low potential (the second output terminal is said to be "Low"). When the comparing voltage is larger than the second reference voltage but smaller than the first reference voltage, the voltage level at the first and second output terminals are still maintained. When the comparing voltage is larger than the first reference voltage, the voltage level at the first output terminal is at a low potential ("Low"), and the voltage level at the second output terminal is at a high potential ("High).

In the above structure, the current magnitudes of the first and the second current sources are proportional with the operation voltage, and the current magnitudes for the first and second current sources can be the same.

The above function generator further comprises a bias circuit including several series-connected resistors, an adjustable resistor, a first transistor and a second transistor. The series-connected resistors have a first end coupled to the operation voltage, and the other end grounded. The first transistor includes a first gate, a first source and a first drain. The second transistor includes a second gate, a second source and a second drain. The first gate is coupled to a potential dividing point in the series-connected resistors that divides the operation voltage. The first source is coupled to a second gate and a second drain of the second transistor, and the first drain is coupled to an adjustable resistor. The second source of the second transistor is coupled to the operation voltage. Thereby, the current of the adjustable resistor is provided to the first and the second current sources.

In addition, the function generator further comprises an operation amplifier. The operation amplifier comprises a positive input terminal, a negative input terminal and an third output terminal. The positive input terminal is coupled to the potential dividing point, the negative input terminal is coupled to the first source of the first transistor that is coupled to the adjustable resistor, and the third output terminal is coupled to the first gate of the first transistor.

As mentioned above, the potentials of the first and second output terminals of the first and the second comparators are determined by the comparing voltage, the first and the second reference voltages. The potentials of the first and the second terminals of the latch circuit can then control the charge and discharge operations of the capacitor. The first output terminal is High and the second output terminal is Low, the capacitor is charged by the first current source. When the second output terminal is High and the first output terminal is Low, the capacitor is discharged by the second current source. According to the charging and discharging time of the capacitor, the output signal of the oscillation frequency can be determined. According to the current for charging and discharging the capacitor, the oscillation frequency of the function generator can be adjusted.

Both the foregoing general description and the following detailed description are exemplary and explanatory only and are not restrictive of the invention, as claimed.

DESCRIPTION OF THE PREFERRED EMBODIMENTS

In the invention, a function generator with an adjustable oscillating frequency is provided. The function generator is designed to eliminate the drawbacks occurring in the conventional structure. For example, the problems such as cost increased, restriction of frequency specification of the quartz oscillator, large power consumption, for reducing the gain of the CMOS inverter for saving power, the frequency output of the oscillator will be stabilized through a long period of time, or even incorrect or incapable of oscillating.

Figure 1:
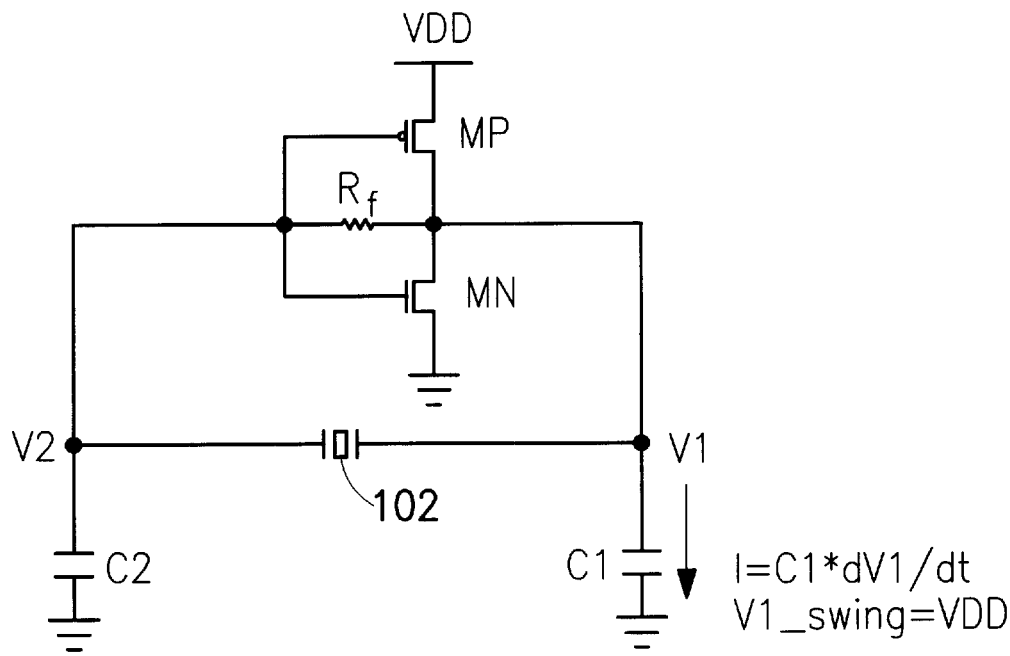
FIG. 1 shows a CMOS inverter used as a Pierce-type transistor oscillator of an amplifier in the prior art.
Figure 2:
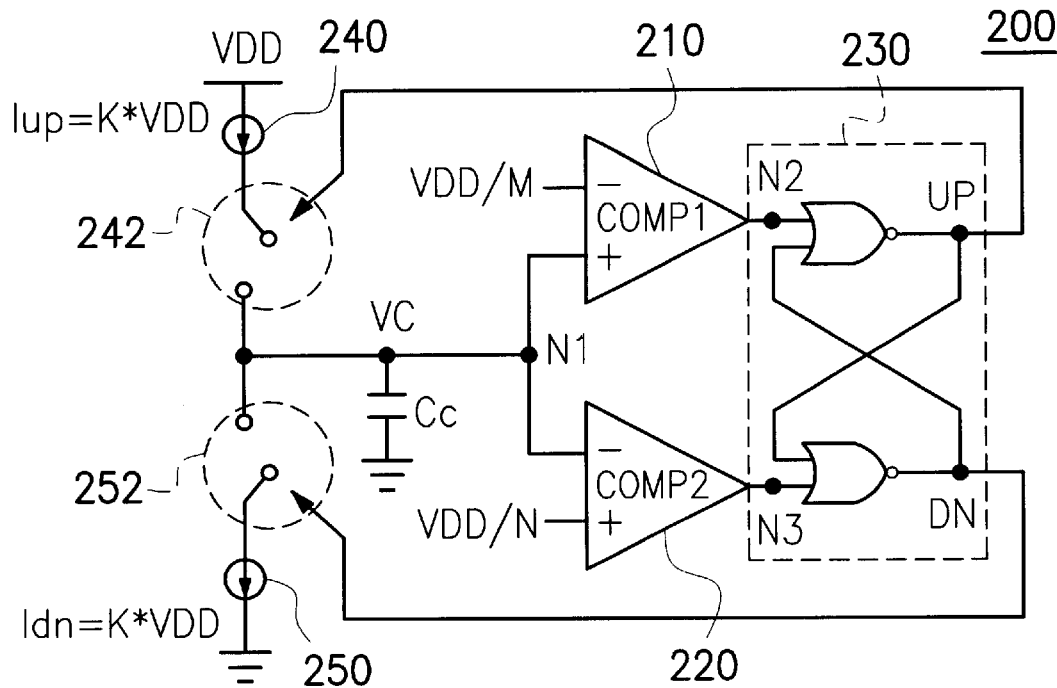
FIG. 2 shows a function generator with an adjustable oscillating frequency according to the present invention.

In FIG. 2, a function generator 200 with an adjustable oscillating frequency is provided. The function generator 200 comprises two comparators 210 and 220, a latch circuit 230 such as a NOR latch circuit or a NAND latch circuit, a capacitor C, and two current sources 240 and 250. The current source (Iup) 240 and (Idn) 250 perform charge/discharge operation on the capacitor C via the switches 242 and 252, An operation voltage VDD/M is connected to the negative input terminal of the comparator 210, while an operation voltage VDD/M is connected to the positive input terminal of the comparator 220. The operation voltage VDD/M is larger than the operation voltage VDD/N. M and N are positive real numbers. The positive input terminal of the comparator 210 and the negative input terminal of the comparator 220 are coupled to a node N1, the node N1 is coupled to the end of a capacitor C, the other end of the capacitor C is grounded.

The output terminals N2 and N3 of the comparators 210 and 220 are coupled to the input terminals of the latch circuit 230. The latch circuit 230 comprises two output terminals UP and DN coupled to the switches 242 and 252 that control the charge/discharge of the capacitor C.

Assuming that the voltage of the node N1 is Vc, when Vc is smaller than VDD/N, the potential of the output terminal N2 of the comparator 210 is Vn2, which is "Low" (that is, the logic "0".). Meanwhile, the voltage of the output terminal N3 is Vn3, which is "High" (that is, the logic "1"). These two voltages Vn2 and Vn3 are fed into the latch circuit 230. by the latch circuit 230, the output terminals UP and DN are "High" and "Low", respectively.

The capacitor C is then charged. That is, the switch 242 is turned on since the output terminal UP is "High" and the switch 252 is turned off since the output terminal DN is "Low", The current source 240 charges the capacitor C.

The voltage Vc at the node N1 is gradually increased. When Vc is larger than VDD/N and still smaller than VDD/M, the voltage Vn2 of the output terminal N2 and the voltage Vn3 of the output terminal N3 are both "Low". The output terminals UP and DN are latched with the previous status by the latch circuit 230, that is, UP and DN is "High" and "Low", respectively. Therefore, the charging process is still continued.

When the voltage Vc at the node N1 raises to be higher than VDD/M, the voltage Vn2 of the output terminal N2 is converted as "High", and the output terminal N3 is converted as "Low" As a result, the output terminal UP is "Low", and the output terminal DN is "High" The switch 252 is turned on and the switch 242 is turned off, the current source 250 to discharge the capacitor C. The voltage Vc of the node N1 is then gradually decreased.

When the voltage Vc of the node N1 is smaller than VDD/N, the output terminal UP of the latch circuit 230 is "High", and the output terminal DN is "Low". The switch 242 is turned on, and the switch 252 is turned off to charge the capacitor C again.

The capacitor C is thus periodically discharged and charged according to the above mechanism. The voltage Vc of the node N1 is thus like a periodic triangular wave. The output signals of UP and DN are the pulse signals. The sequence is shown as FIG. 3. The period of the oscillating frequency is a sum of the charging and discharging period.

Figure 3:
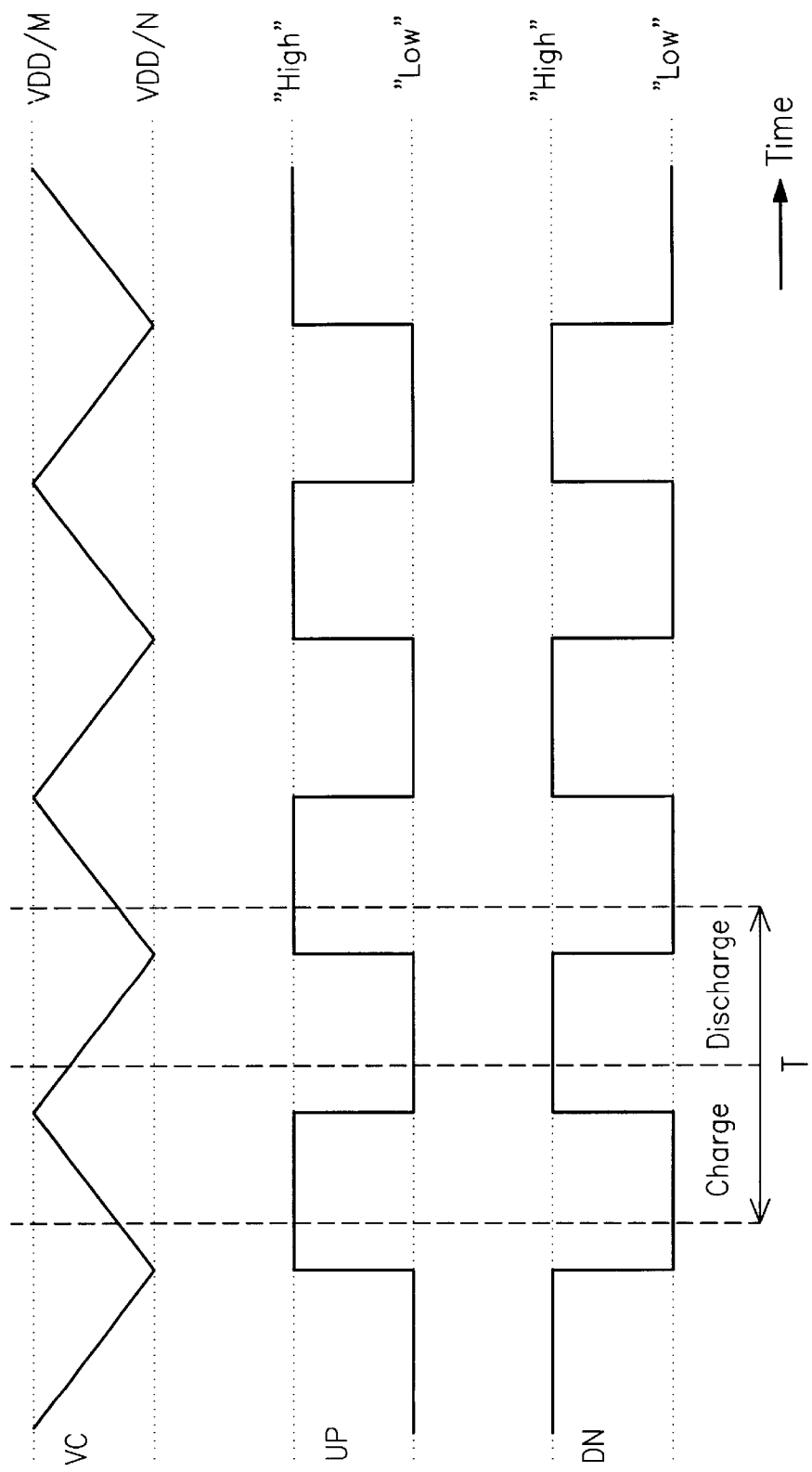
FIG. 3 shows a potential level of a Vc, UP and DN as shown in FIG. 2.

The high potential of the comparators is VDD/M, and the low potential is VDD/N. The period of the output of the function generator is equal to the sum of the charging and discharging time. Referring to FIG. 3, the diagram of the Vc, UP and DN of the latch circuit 230 is shown. The period T is equal to a sum of the charging period and the discharging period. That is, $T=T_{charge}+T_{discharge}$.

$$T=T_{charge}+T_{discharge}=Cc(VDD/M-VDD/N)/Iup+Cc(VDD/M-VDD/N)/Idn \quad (1)$$

If Iup=Idn=k*VDD (K is a positive real number)

$$T=2[Cc(VDD/M-VDD/N)]/(k*VDD)=2[Cc((1/M)-(1/N)]/k \quad (2)$$

From the equation (1) and (2), the period T is independent of VDD when the current sources Iup and Idn are the same. This is because the operation (reference) voltages of the comparators and the current for charging/discharging are both proportional to VDD. Therefore, a oscillating frequency is independent of the voltage source. According to the time of the charging and discharging operations, the oscillating frequency of the function generated is determined. The oscillating frequency can also be adjusted according to the current magnitude of the current of charging and discharging operations.

Figure 4:
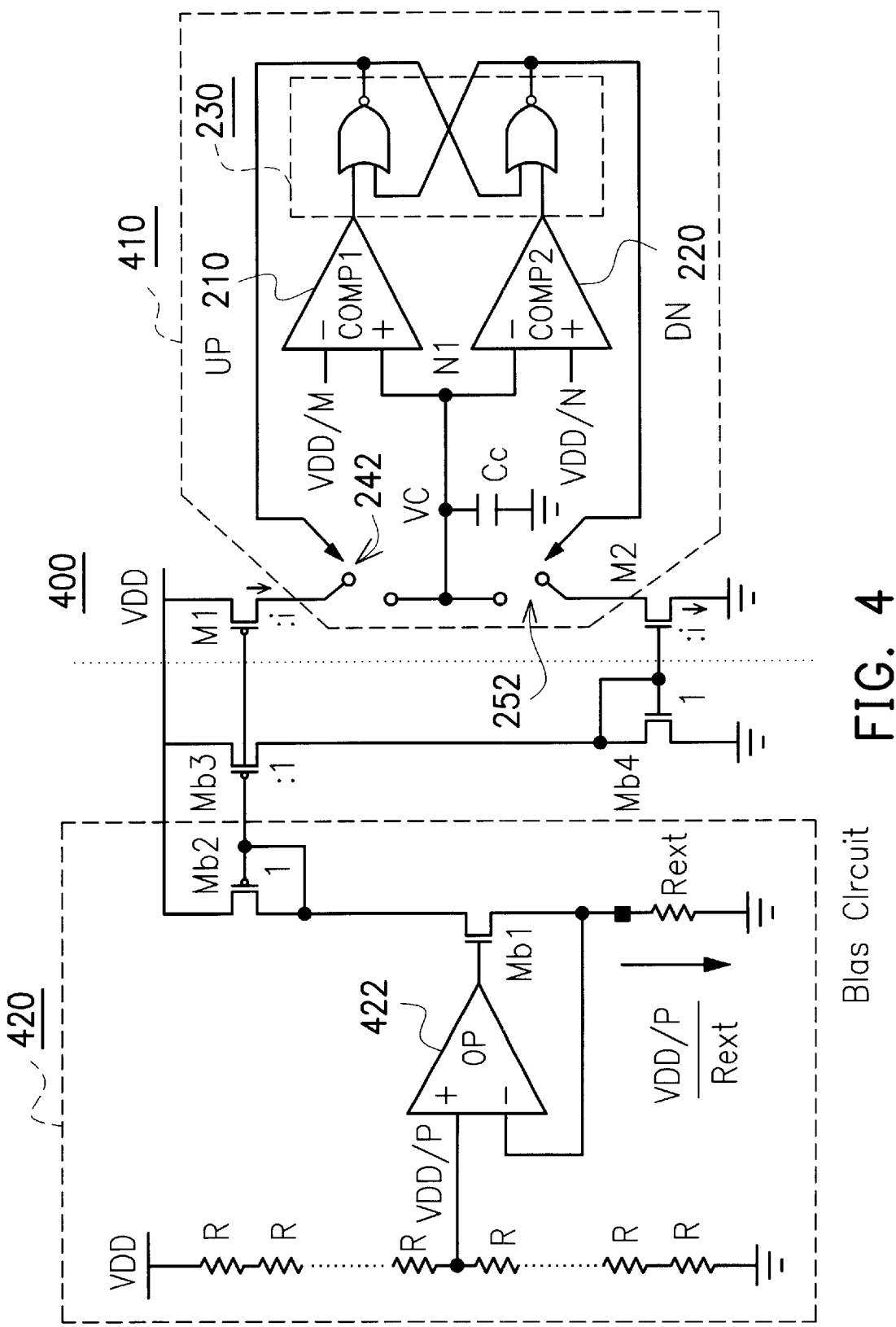
FIG. 4 shows the structure of the function generator with an adjustable oscillating frequency.

FIG. 4 shows the structure 400 of the generator with an adjustable oscillating frequency. The structure comprises a function generator 410 and a bias current circuit 420 which provides the current source. The elements comprised in the function generator 410 are similar to those in FIG. 2. Therefore, the same symbols and reference numerals are used without further description and definition. The current provided by the bias current circuit 420 is proportional to the voltage source VDD.

The bias current circuit 420 comprises several series-connected resistors R with one end coupled to VDD, and the other end grounded. An operation amplifier (OP) 422 is comprised with a positive input terminal coupled to a potential dividing point of the series-connected resistors R with a voltage VDD/P. P is a ratio of the number of the resistors under the potential dividing point to the total number of the series-connected resistors R. The gate of the transistor Mb1 is coupled to the output terminal of the operation amplifier 422. the drain of the transistor Mb1 is coupled to adjustable resistor Rext and the negative input terminal of the operation amplifier 422. the drain of Mb1 is coupled to a gate and a source of the transistor Mb2. The transistor Mb2 also has a source coupled to the operation voltage VDD.

From FIG. 4, it is known that in addition to the bias current circuit 420, the structure further comprises a transistor Mb3 and the transistor M1 Both gates of the transistors Mb3 and M1 are coupled to the gate of the transistor Mb2. the sources of the transistors Mb3 and M1 are coupled to the operation voltage VDD The drain of the transistor Mb3 is coupled to a gate and a source of the transistor Mb4. The gate of the transistor M2 is coupled to the gate of the transistor Mb4.

Assuming the length-to-width ratio between the transistor Mb2 and the transistor M1 is 1:I, and the length-to-width ratio between the transistor Mb4 and the transistor M2 is also 1:i, the current through the adjustable resistor Rext is (VDD/P)/Rext. The charging/discharging current is Iup= Idn=((VDD/P)/Rext)×i. The factor in the oscillating period T is k=×Rext). From the above structure, the oscillating period T is independent of the operation voltage VDD.

Figure 5:
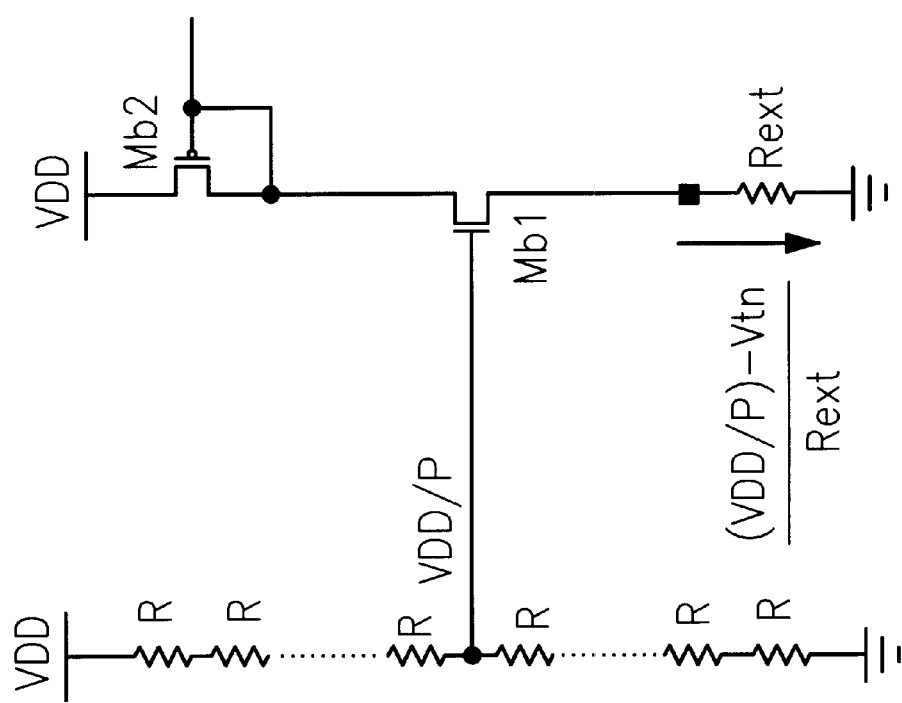
FIG. 5 shows another embodiment of the current bias circuit as shown in FIG. 4.

Referring to FIG. 5, another embodiment of the bias current circuit is illustrated. The operation amplifier is removed. From the above, it is known that only by providing a stable current to the function generator 410, the oscillating frequency can be adjusted by the adjustable resistor Rext.

If the adjustable resistor Rext is disposed external to the integrated circuit, the frequency of the pulse signal can be adjusted by adjusting the resistance of the adjustable resistor Rext externally.

In addition to the advantages of being integrated without other digital circuits on the chip, the invention further provides the features of: 1. The oscillating frequency is independent of the external operation voltage VDD. 2. The frequency of the oscillator can be adjusted by adjusting external resistor. It is advantageous to withstanding voltage source noise and to the sensitivity of practical application.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A function generator with an adjustable oscillating frequency supplied with a voltage source VDD, the function generator comprising:

a first comparator and a second comparator, an operation voltage of the first comparator is referred as a first reference voltage, and an operation voltage of the second comparator is referred as a second reference voltage, wherein the first reference voltage and the second voltage are not the same;

a latch circuit, for latching the outputs of the first comparator and the second comparator respectively;

a capacitor unit, with one end grounded and the other end having a comparing voltage;

a first current source and a second current source, for respectively charging or discharging of the capacitor, unit in response to outputs of the latch circuit, wherein currents of the first current source and the second current source are proportional to the voltage source VDD;

a plurality of series-connected resistors, with one end coupled to the voltage source VDD and the other end grounded;

an adjustable resistor;

a first transistor, having a first gate, a first source and a first drain, wherein the first gate is coupled to a potential dividing point in the series-connected resistors to divide the voltage source VDD, the first drain is coupled to the adjustable resistor; and a second transistor, comprising a second gate, a second source and a second drain, wherein the second gate and the second drain are connected and coupled to the first source of the first transistor; wherein a current through the adjustable resistor is proportional to a current of the first and the second current source, and the currents of the first and the second current sources are controlled by the current of the adjustable resistor.

2. The function generator according to claim 1, wherein the first reference voltage is VDD/M, and the second reference voltage is VDD/N, M, N are positive real numbers, and M is smaller than N.

3. The method according to claim 1, wherein the currents of the first and the second current source are the same.

4. The function generator according to claim 1, wherein the latch circuit is a NOR latch circuit.

5. The function generator according to claim 1, wherein the latch circuit is a NAND latch circuit.

6. The function generator according to claim 1, further comprising:

an operation amplifier, coupled between the first transistor and the potential dividing point, comprising a positive input terminal, a negative input terminal and an output terminal, wherein the positive input terminal is coupled to the potential dividing point, the negative input terminal is coupled to the first drain of the first transistor that coupled to the adjustable resistor, and the output terminal is coupled to the gate of the first transistor.

7. A method of adjusting an oscillating frequency of a signal output by a function generator, wherein the function generator is operating with an operation voltage VDD, the method comprising:

comparing a first reference voltage and a second reference voltage with a voltage level of the signal output by the function generator, wherein the first reference voltage and the second voltage are not the same, the first reference voltage and the second reference voltage are proportional to the operation voltage VDD; and latching outputs of the comparison of the first reference voltage and the second reference voltage with the voltage level of the signal output by the function generator, wherein when the voltage level of the signal output by the function generator is lower than the first reference voltage, increasing the voltage level of the signal output by the function generator by a first current source, when the voltage level of the signal output by the function generator is higher than the second reference voltage, decreasing the voltage level of the signal output by the function generator by a second current source, the currents of the first current source and the second current source are proportional to the operation voltage VDD;

wherein the currents of the first and the second current sources are controlled by adjusting the resistance of an adjustable resistor.

8. The method according to claim 7, wherein the currents of the first and the second current sources are the same.

9. A function generator with an adjustable oscillating frequency supplied with a voltage source VDD, the function generator comprising:

a capacitor unit, with a stored voltage stored therein;

a first comparator and second comparator, the first comparator for comparing a first reference voltage with a comparing voltage, the second comparator for comparing a second reference voltage with the comparing voltage, wherein the first reference voltage and the second reference voltage are not the same, the first reference voltage and the second reference voltage are proportional to the voltage source VDD;

a first current source and a second current source, for respectively charging or discharging of the capacitor unit in response to outputs of the first comparator and the second comparator, wherein currents of the first current source and the second current source are proportional to the voltage source VDD; and an adjustable resistor, wherein the currents of the first and the second current sources are controlled by adjusting the resistance of the adjustable resistor.

10. The function generator according to claim 9, further comprising:

a plurality of series-connected resistors, with one end coupled to the voltage source VDD and the other end grounded;

a first transistor, having first gate, a first source and a first drain, wherein the first gate is coupled to a potential dividing point in the series-connected resistors to divide the voltage source VDD, the first drain is coupled to the adjustable resistor;

a second transistor, comprising a second gate, a second source and a second drain, wherein the second gate and the second drain are connected and coupled to the first source of the first transistor; wherein a current through the adjustable resistor is proportional to a current of the first and the second current sources, and the currents of the first and the second current sources are controlled by the current of the adjustable resistor.

11. The function generator according to claim 10, further comprising:

an operation amplifier, coupled between the first transistor and the potential dividing point, comprising a positive input terminal, a negative input terminal and an output terminal, wherein the positive input terminal is coupled to the potential dividing point, the negative input terminal is coupled to the first drain of the first transistor that is coupled to the adjustable resistor, and the third output terminal is coupled to the gate of the first transistor.

12. The function generator according to claim 9, wherein the currents of the first and the second current sources are the same.

13. A method of adjusting an oscillating frequency of a signal output by a function generator, the function generator being operating with a voltage source VDD, the method comprising:

comparing a first reference voltage and a second reference voltage with a voltage level of the signal output by the function generator, wherein the first and the second reference voltages are not the same, the first and the second reference voltages are proportional to the voltage source VDD;

increasing the voltage level of the signal output by a first current source or decreasing the voltage level of the signal output by a second current source respectively in response to outputs of the comparison of the first reference voltage and the second reference voltage with the voltage level of the signal output by the function generator, wherein the currents of the first and the second current sources are proportional to the voltage source VDD and controlled by adjusting the resistance of an adjustable resistor.

14. The function generator according to claim 13, wherein the currents of the first and the second current sources are the same.

* * * * *